(12) United States Patent
Fang et al.

(10) Patent No.: US 9,379,079 B1
(45) Date of Patent: Jun. 28, 2016

(54) FLIP CHIP SCHEME AND METHOD OF FORMING FLIP CHIP SCHEME

(71) Applicant: MEDIATEK INC., Hsin-Chu (TW)

(72) Inventors: Jia-Wei Fang, Hsinchu (TW); Shen-Yu Huang, Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/636,137

(22) Filed: Mar. 2, 2015

Related U.S. Application Data

(60) Provisional application No. 62/097,137, filed on Dec. 29, 2014.

(51) Int. Cl.
*H01L 23/00* (2006.01)
*H01L 23/528* (2006.01)
*H01L 23/488* (2006.01)

(52) U.S. Cl.
CPC ............ *H01L 24/17* (2013.01); *H01L 23/5283* (2013.01); *H01L 24/11* (2013.01); *H01L 2224/17177* (2013.01)

(58) Field of Classification Search
None
See application file for complete search history.

(56) References Cited

U.S. PATENT DOCUMENTS

| | | | |
|---|---|---|---|
| 7,081,672 B1 | 7/2006 | Govind | |
| 8,350,375 B2 | 1/2013 | Ali | |
| 8,873,209 B2 * | 10/2014 | Blanc | H01L 23/60 257/365 |
| 2006/0163715 A1 * | 7/2006 | Pendse | H01L 23/49838 257/691 |
| 2007/0278688 A1 * | 12/2007 | Lin | H01L 21/768 257/760 |
| 2009/0283904 A1 * | 11/2009 | Ali | H01L 23/5286 257/737 |
| 2013/0087366 A1 * | 4/2013 | Michael | H01L 23/50 174/252 |
| 2013/0155555 A1 * | 6/2013 | Blanc | H01L 23/60 361/56 |
| 2015/0206857 A1 * | 7/2015 | Tan | H01L 23/49562 257/337 |

OTHER PUBLICATIONS

He, L., Elassaad, S., "Introduction to Chip-Package Co-Design" International Symposium of Quality Electronic Design, (ISEQD) 2005.*

* cited by examiner

*Primary Examiner* — Joseph Schoenholtz
(74) *Attorney, Agent, or Firm* — Winston Hsu; Scott Margo

(57) ABSTRACT

The present invention provides a flip chip scheme and a method of forming the flip chip scheme. The flip chip scheme comprises: a plurality of bumps, some of the bumps arranged in a first pattern, respectively, and some of the bumps arranged in a second pattern different from the first pattern, respectively; wherein the first pattern is an equilateral triangle arranged by three bumps, and the second pattern is a square arranged by four bumps. The method comprises: arranging some of the bumps in a first pattern, respectively, and arranging some of the bumps in a second pattern different from the first pattern, respectively; wherein the first pattern is an equilateral triangle arranged by three bumps, and the second pattern is a square arranged by four bumps.

24 Claims, 7 Drawing Sheets

FLIP CHIP SCHEME AND METHOD OF FORMING FLIP CHIP SCHEME

CROSS REFERENCE TO RELATED APPLICATIONS

This application claims the benefit of U.S. Provisional Application No. 62/097,137, filed on Dec. 29, 2014 and included herein by reference.

BACKGROUND

The disclosed embodiments of the present invention relate to a flip chip scheme and a method of forming the flip chip scheme, and more particularly, to a flip chip scheme and a method of forming the flip chip scheme which can fit power domains, reduce IR drops, shift bumps to enhance signal routing, and have a maximum bump number in every power domain.

Applications of using regular inline-bumps or stagger-bumps have already been disclosed and discussed in various literatures, such as U.S. Pat. No. 8,350,375 and U.S. Pat. No. 7,081,672. Please refer to FIG. 1. FIG. 1 is a simplified diagram of a conventional flip chip scheme 100 as shown in FIG. 3 of the U.S. Pat. No. 8,350,375. As shown in FIG. 1, the conventional flip chip scheme 100 only use regular inline-bumps, and therefore the conventional flip chip scheme 100 is not capable of fitting non-uniform power domains and thus result in worse IR drops.

Please refer to FIG. 2. FIG. 2 is a simplified diagram of a conventional flip chip scheme 200 as shown in FIG. 8 of the U.S. Pat. No. 8,350,375. As shown in FIG. 2, the conventional flip chip scheme 200 only use regular stagger-bumps, and therefore the conventional flip chip scheme 200 is not capable of fitting non-uniform power domains and thus result in worse IR drops.

SUMMARY

In accordance with exemplary embodiments of the present invention, a flip chip scheme and a method of forming the flip chip scheme which can fit power domains, reduce IR drops, shift bumps to enhance signal routing, and have a maximum bump number in every power domain are proposed to solve the above-mentioned problem.

According to a first aspect of the present invention, an exemplary flip chip scheme is disclosed. The flip chip scheme comprises: a plurality of bumps, some of the bumps arranged in a first pattern, respectively, and some of the bumps arranged in a second pattern different from the first pattern, respectively; wherein the first pattern is an equilateral triangle arranged by three bumps, and the second pattern is a square arranged by four bumps.

According to a second aspect of the present invention, another exemplary flip chip scheme is disclosed. The flip chip scheme comprises: a non-uniform power domain; and a non-uniform bump map, formed by a plurality of bumps to fit the non-uniform power domain.

According to a third aspect of the present invention, an exemplary method of forming a flip chip scheme comprising a plurality of bumps is disclosed. The method comprises: arranging some of the bumps in a first pattern, respectively, and arranging some of the bumps in a second pattern different from the first pattern, respectively; wherein the first pattern is an equilateral triangle arranged by three bumps, and the second pattern is a square arranged by four bumps.

According to a fourth aspect of the present invention, an exemplary method of forming a flip chip scheme is disclosed. The method comprises: forming a non-uniform power domain; and forming a non-uniform bump map by a plurality of bumps to fit the non-uniform power domain.

Briefly summarized, the present invention can place the bumps non-uniformly based on power distributions in the flip chip scheme, and comparing with the conventional bump patterns, the present invention has advantages of fitting the power domains, reducing IR drops, shifting the bumps to enhance the signal routing, and having a maximum bump number in every power domain.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
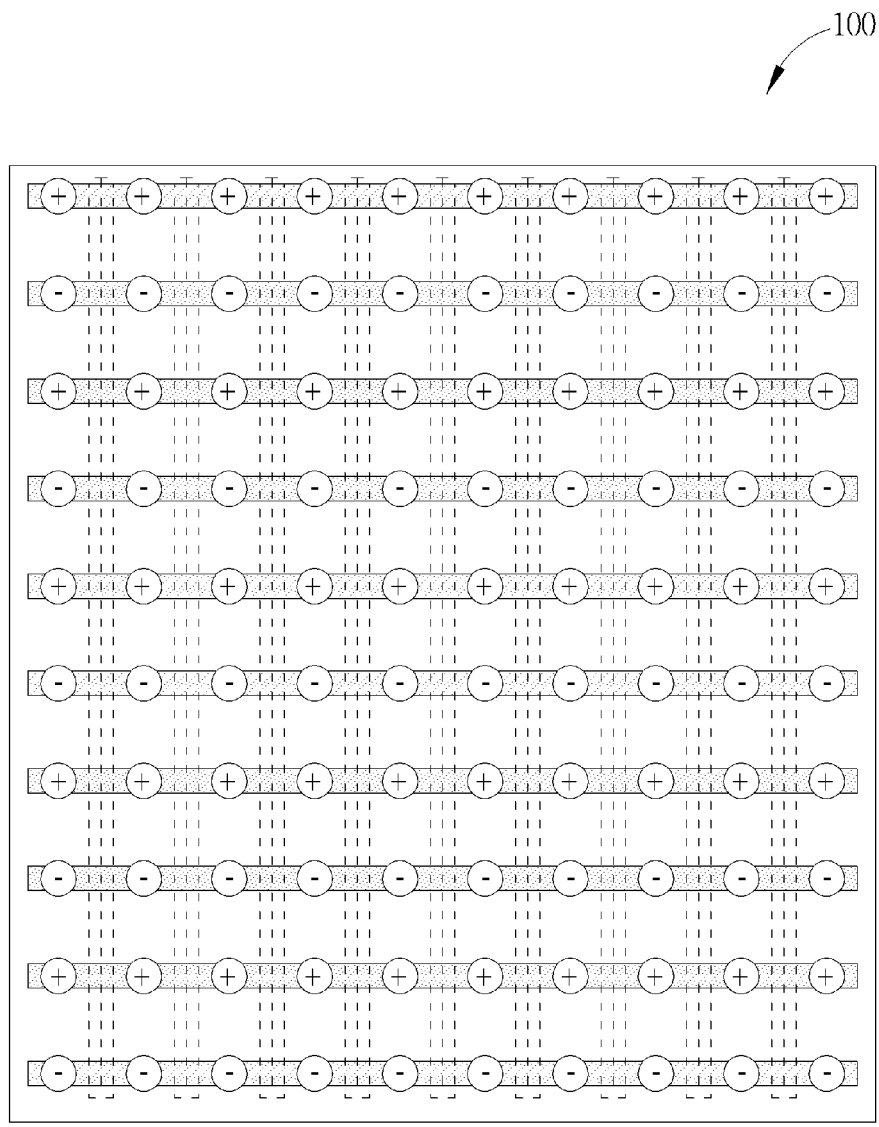
FIG. 1 is a simplified diagram of a conventional flip chip scheme as shown in FIG. 3 of the U.S. Pat. No. 8,350,375.
Figure 2:
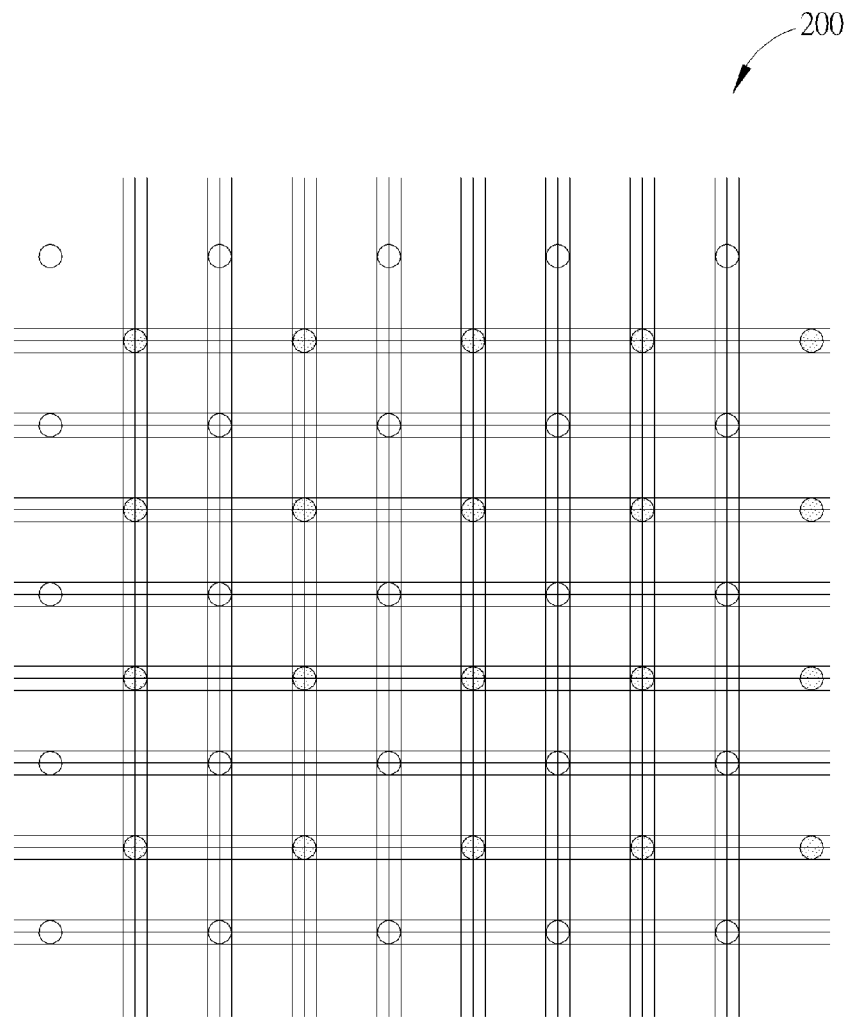
FIG. 2 is a simplified diagram of a conventional flip chip scheme as shown in FIG. 8 of the U.S. Pat. No. 8,350,375.
Figure 3:
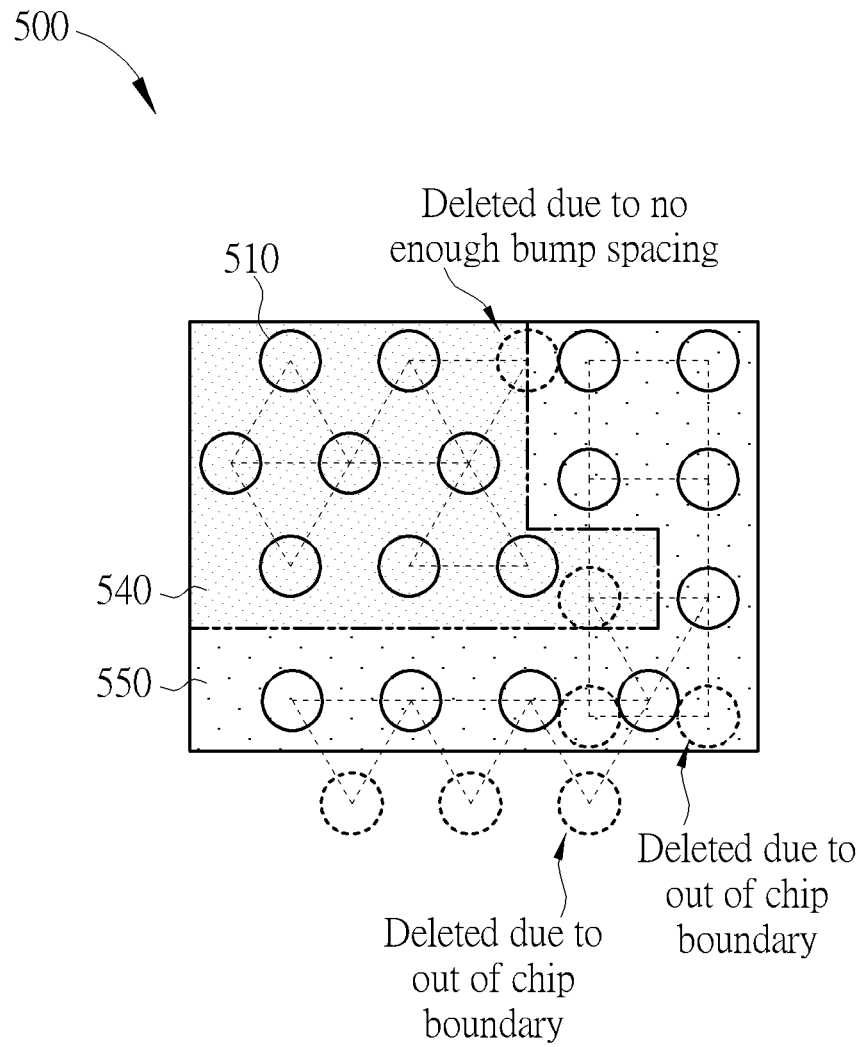
FIG. 3 is a simplified diagram of a flip chip scheme according to a first exemplary embodiment of the present invention.
Figure 4:
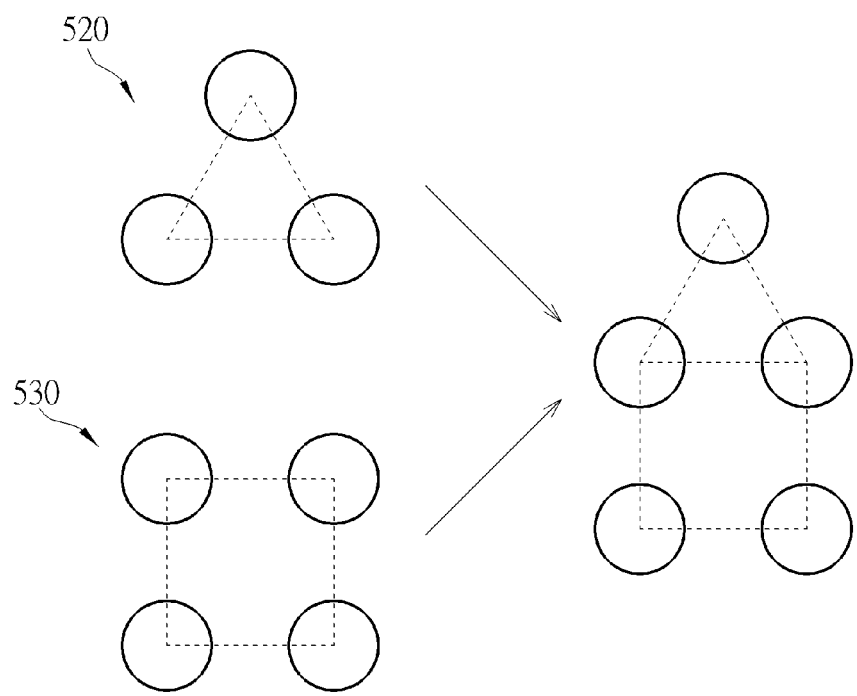
FIG. 4 is a simplified diagram of the first pattern, the second pattern, and a combination of the first pattern and the second pattern.

Please refer to FIG. 3. FIG. 3 is a simplified diagram of a flip chip scheme 500 according to a first exemplary embodiment of the present invention, wherein the flip chip scheme 500 can be applied to an SOC integrated circuit. As shown in FIG. 3, the flip chip scheme 500 comprises a plurality of bumps 510, wherein the bumps 510 can comprise power bumps and ground bumps. Some of the bumps 510 arranged in a first pattern, respectively, and some of the bumps 510 arranged in a second pattern different from the first pattern, respectively. The flip chip scheme 500 comprises a bump map formed by a plurality of first patterns and a plurality of second patterns as shown in FIG. 3. Please refer to FIG. 4. FIG. 4 is a simplified diagram of the first pattern, the second pattern, and a combination of the first pattern and the second pattern (i.e. a combination of the equilateral triangle and the square). As shown in FIG. 4, the first pattern can be an equilateral triangle 520 arranged by three bumps 510, and the second pattern can be a square arranged 530 by four bumps 510.

As shown in FIG. 3, the flip chip scheme 500 comprises non-uniform power domains 540, 550, and a non-uniform bump map formed by a plurality of bumps 510 to fit the non-uniform power domains 540, 550. In this embodiment, two bumps 510 are deleted when there is no enough bump spacing, and five bumps 510 are deleted due to out of the chip boundary. Thus, the present invention can place the bumps 510 non-uniformly based on power distributions in the flip chip scheme 500, and comparing with the conventional bump patterns, the present invention has advantages of fitting the power domains, reducing IR drops, and having a maximum bump number in every power domain.

Figure 5:
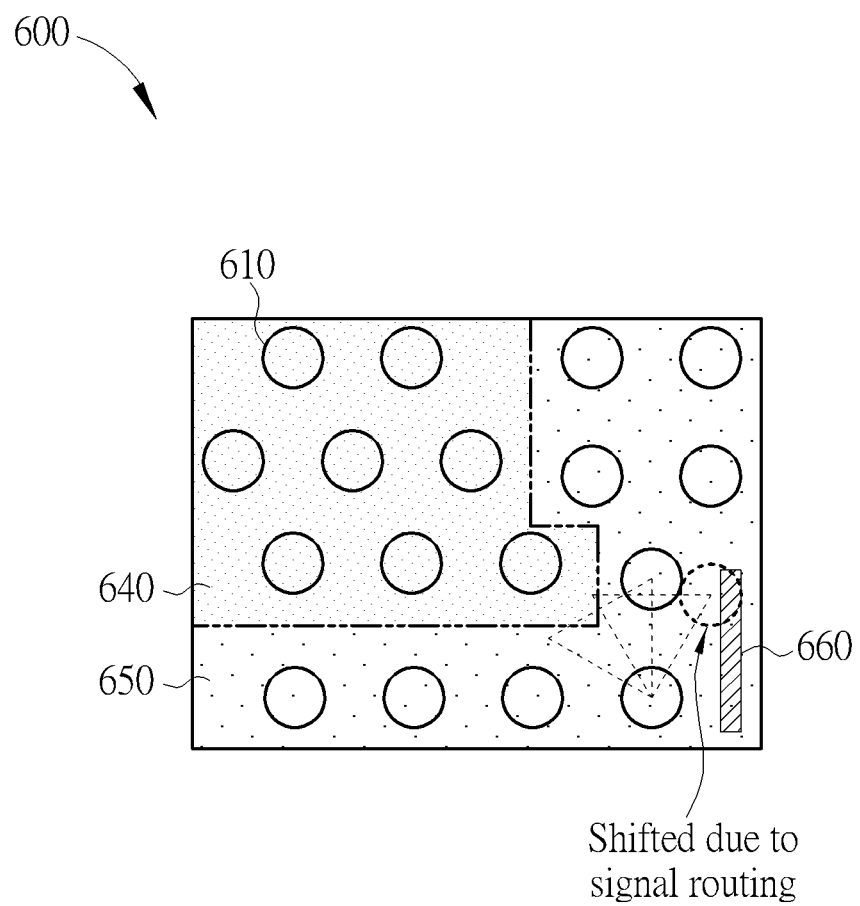
FIG. 5 is a simplified diagram of a flip chip scheme according to a second exemplary embodiment of the present invention

Please refer to FIG. 5. FIG. 5 is a simplified diagram of a flip chip scheme 600 according to a second exemplary embodiment of the present invention, wherein the flip chip scheme 600 can be applied to an SOC integrated circuit. As shown in FIG. 5, the flip chip scheme 600 comprises a plurality of bumps 610, wherein the bumps 610 can comprise power bumps and ground bumps. Some of the bumps 610 arranged in a first pattern, respectively, and some of the bumps 610 arranged in a second pattern different from the first pattern, respectively. The flip chip scheme 600 comprises a bump map formed by a plurality of first patterns and a plurality of second patterns as shown in FIG. 3. Please refer to FIG. 4. FIG. 4 is a simplified diagram of the first pattern, the second pattern, and a combination of the first pattern and the second pattern (i.e. a combination of the equilateral triangle and the square). As shown in FIG. 4, the first pattern can be an equilateral triangle 620 arranged by three bumps 610, and the second pattern can be a square arranged 630 by four bumps 610.

As shown in FIG. 5, the flip chip scheme 600 comprises non-uniform power domains 640, 650, a non-uniform bump map formed by a plurality of bumps 610 to fit the non-uniform power domains 640, 650, and a signal routing 660. In this embodiment, two bumps 610 have been deleted due to no enough bump spacing and five bumps 610 have been deleted due to out of the chip boundary, which is similar to the first exemplary embodiment of the present invention. In addition, one bump 610 is shifted because the signal routing 660 is near the shifted bump 610. Thus, the present invention can place the bumps 610 non-uniformly based on power distributions in the flip chip scheme 600, and comparing with the conventional bump patterns, the present invention has advantages of fitting the power domains, reducing IR drops, shifting the bumps to enhance the signal routing, and having a maximum bump number in every power domain.

Figure 6:
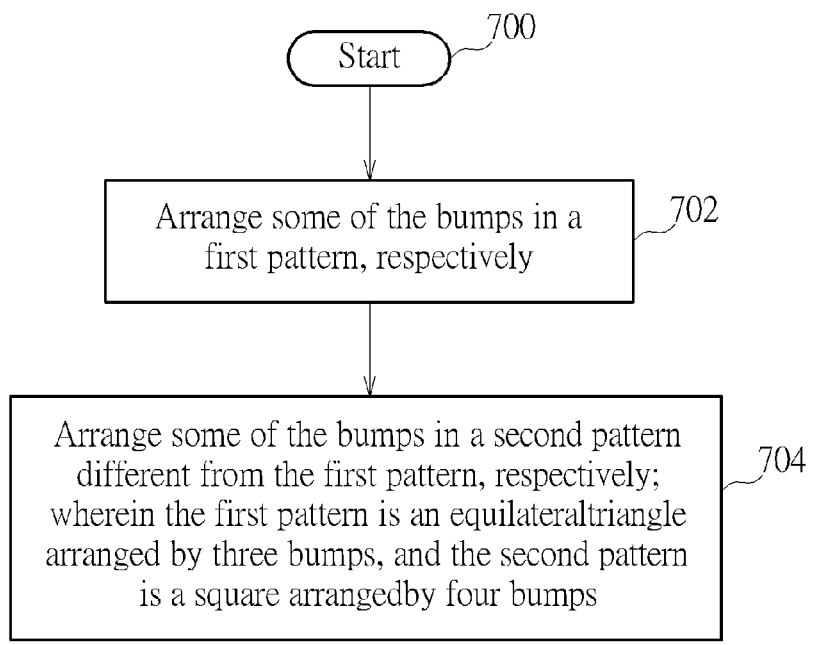
FIG. 6 is a flowchart showing a method of forming a flip chip scheme comprising a plurality of bumps in accordance with the flip chip schemes in FIG. 3 and FIG. 5.

Please refer to FIG. 6. FIG. 6 is a flowchart showing a method of forming a flip chip scheme comprising a plurality of bumps in accordance with the flip chip schemes 500 and 600 in the above embodiment. Provided that the result is substantially the same, the steps in FIG. 6 are not required to be executed in the exact order shown in FIG. 6. The method in accordance with the above embodiment of the flip chip schemes 500 and 600 in the present invention comprises the following steps:

Step 700: Start.

Step 702: Arrange some of the bumps in a first pattern, respectively.

Step 704: Arrange some of the bumps in a second pattern different from the first pattern, respectively; wherein the first pattern is an equilateral triangle arranged by three bumps, and the second pattern is a square arranged by four bumps.

In addition, the above method can further comprise: forming a bump map by a plurality of first patterns and a plurality of second patterns, and the above method can also further comprise: deleting at least one of the bumps when there is no enough bump spacing. Or, the above method can further comprise: deleting at least one of the bumps when the bump is out of the chip boundary. Or, the above method can further comprise: shifting at least one of the bumps when there is a signal routing near the shifted bump.

Figure 7:
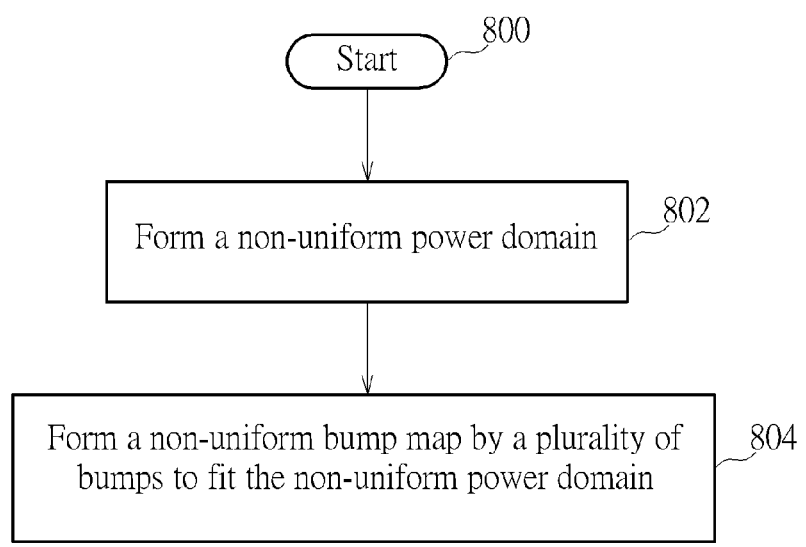
FIG. 7 is a flowchart showing a method of forming a flip chip scheme in accordance with the flip chip schemes in FIG. 3 and FIG. 5.

Please refer to FIG. 7. FIG. 7 is a flowchart showing a method of forming a flip chip scheme in accordance with the flip chip schemes 500 and 600 in the above embodiment. Provided that the result is substantially the same, the steps in FIG. 7 are not required to be executed in the exact order shown in FIG. 7. The method in accordance with the above embodiment of the flip chip schemes 500 and 600 in the present invention comprises the following steps:

Step 800: Start.

Step 802: Form a non-uniform power domain.

Step 804: Form a non-uniform bump map by a plurality of bumps to fit the non-uniform power domain.

In addition, the above method can further comprise: arranging some of the bumps in a first pattern, respectively, and arranging some of the bumps in a second pattern different from the first pattern, respectively, wherein the first pattern is an equilateral triangle arranged by three bumps, and the second pattern is a square arranged by four bumps, and the above method can further comprise: forming a bump map by a plurality of first patterns and a plurality of second patterns. Moreover, the above method can further comprise: deleting at least one of the bumps when there is no enough bump spacing. Or, the above method can further comprise: deleting at least one of the bumps when the bump is out of the chip boundary. Or, the above method can further comprise: shifting at least one of the bumps when there is a signal routing near the shifted bump.

Briefly summarized, the present invention can place the bumps non-uniformly based on power distributions in the flip chip scheme, and comparing with the conventional bump patterns, the present invention has advantages of fitting the power domains, reducing IR drops, shifting the bumps to enhance the signal routing, and having a maximum bump number in every power domain.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip chip scheme, comprising:
a plurality of bumps, some of the bumps arranged in a first pattern, respectively, and some of the bumps arranged in a second pattern different from the first pattern, respectively;
wherein the first pattern is an equilateral triangle arranged by three bumps, and the second pattern is a square arranged by four bumps.

2. The flip chip scheme of claim 1, further comprising:
a bump map, formed by a plurality of first patterns and a plurality of second patterns.

3. The flip chip scheme of claim 2, wherein bump map comprises at least a pattern combining one of the first patterns and one of the second patterns, which combines the equilateral triangle and the square.

4. The flip chip scheme of claim 1, wherein at least one of the bumps is deleted when there is no enough bump spacing.

5. The flip chip scheme of claim 1, wherein at least one of the bumps is shifted when there is a signal routing near the shifted bump.

6. A flip chip scheme, comprising:
a non-uniform power domain; and
a non-uniform bump map, formed by a plurality of bumps to fit the non-uniform power domain.

7. The flip chip scheme of claim 6, wherein some of the bumps are arranged in a first pattern, respectively, and some of the bumps are arranged in a second pattern different from the first pattern, respectively.

8. The flip chip scheme of claim 7, wherein the first pattern is an equilateral triangle arranged by three bumps, and the second pattern is a square arranged by four bumps.

9. The flip chip scheme of claim 8, wherein the bump map is formed by a plurality of first patterns and a plurality of second patterns.

10. The flip chip scheme of claim 9, wherein bump map comprises at least a pattern combining one of the first patterns and one of the second patterns, which combines the equilateral triangle and the square.

11. The flip chip scheme of claim 6, wherein at least one of the bumps is deleted when there is no enough bump spacing.

12. The flip chip scheme of claim 6, wherein at least one of the bumps is shifted when there is a signal routing near the shifted bump.

13. A method of forming a flip chip scheme comprising a plurality of bumps, the method comprising:
arranging some of the bumps in a first pattern, respectively, and
arranging some of the bumps in a second pattern different from the first pattern, respectively;
wherein the first pattern is an equilateral triangle arranged by three bumps, and the second pattern is a square arranged by four bumps.

14. The method of claim 13, further comprising:
forming a bump map by a plurality of first patterns and a plurality of second patterns.

15. The method of claim 14, wherein bump map comprises at least a pattern combining one of the first patterns and one of the second patterns, which combines the equilateral triangle and the square.

16. The method of claim 13, further comprising:
deleting at least one of the bumps when there is no enough bump spacing.

17. The method of claim 13, further comprising:
shifting at least one of the bumps when there is a signal routing near the shifted bump.

18. A method of forming a flip chip scheme, comprising:
forming a non-uniform power domain; and
forming a non-uniform bump map by a plurality of bumps to fit the non-uniform power domain.

19. The method of claim 18, further comprising:
arranging some of the bumps in a first pattern, respectively, and
arranging some of the bumps in a second pattern different from the first pattern, respectively.

20. The method of claim 19, wherein the first pattern is an equilateral triangle arranged by three bumps, and the second pattern is a square arranged by four bumps.

21. The method of claim 20, further comprising:
forming a bump map by a plurality of first patterns and a plurality of second patterns.

22. The method of claim 21, wherein bump map comprises at least a pattern combining one of the first patterns and one of the second patterns, which combines the equilateral triangle and the square.

23. The method of claim 18, further comprising:
deleting at least one of the bumps when there is no enough bump spacing.

24. The method of claim 18, further comprising:
shifting at least one of the bumps when there is a signal routing near the shifted bump.

* * * * *